United States Patent
Oklobdzija et al.

(10) Patent No.: US 6,753,715 B2
(45) Date of Patent: Jun. 22, 2004

(54) SYSTEM FOR SYMMETRIC PULSE GENERATOR FLIP-FLOP

(75) Inventors: Volin G. Oklobdzija, Berkeley, CA (US); William W. Walker, Los Gatos, CA (US); Nikola M. Nedovic, San Jose, CA (US)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/251,921

(22) Filed: Sep. 20, 2002

(65) Prior Publication Data

US 2004/0057313 A1 Mar. 25, 2004

(51) Int. Cl.[7] .............................................. H03K 3/356
(52) U.S. Cl. ...................... 327/208; 327/211; 327/218
(58) Field of Search ................................ 327/199, 200, 327/201, 208, 209, 210, 211, 212, 218; 326/95, 96, 97, 98

(56) References Cited

U.S. PATENT DOCUMENTS

| | | | | |
|---|---|---|---|---|
| 5,867,049 A | * | 2/1999 | Mohd | 327/200 |
| 6,163,173 A | * | 12/2000 | Storino et al. | 326/98 |
| 6,441,648 B1 | * | 8/2002 | Hsu et al. | 326/98 |
| 6,507,228 B2 | * | 1/2003 | Boerstler et al. | 327/199 |

* cited by examiner

*Primary Examiner*—Tuan T. Lam
(74) *Attorney, Agent, or Firm*—Sheppard Mullin Richter & Hampton LLP

(57) ABSTRACT

A Symmetric Pulse Generator Flip-Flop (SPG-FF). The flip-flop comprises two pulse generator stages that each respond to one particular transition of an input clock signal. Thus, the flip-flop is triggered on both the rising and falling edge of the clock signal to capture an input data signal. The outputs of the generator stages are combined to form a flip-flop output.

11 Claims, 5 Drawing Sheets

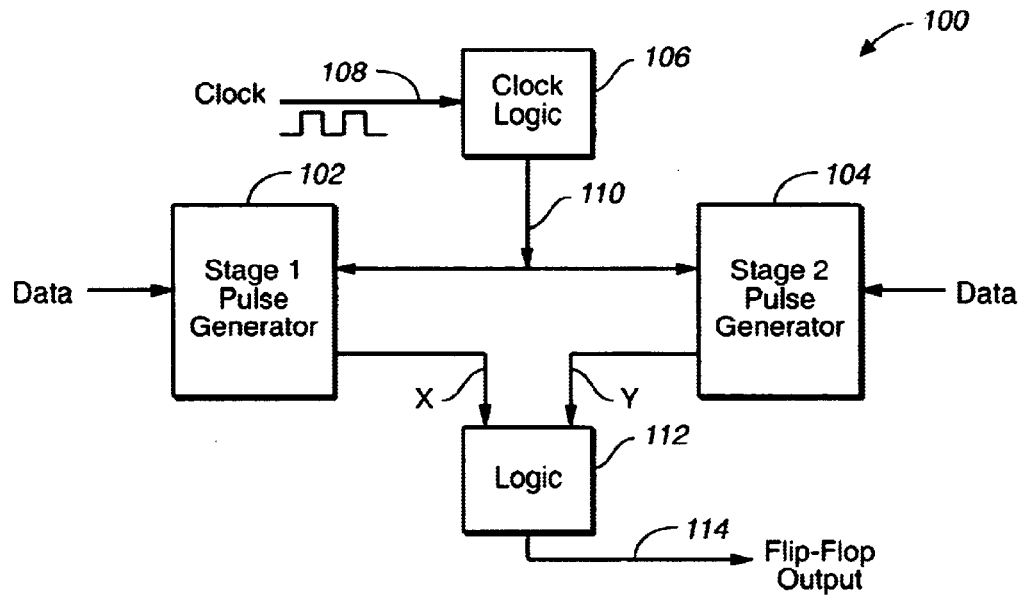
FIG._1
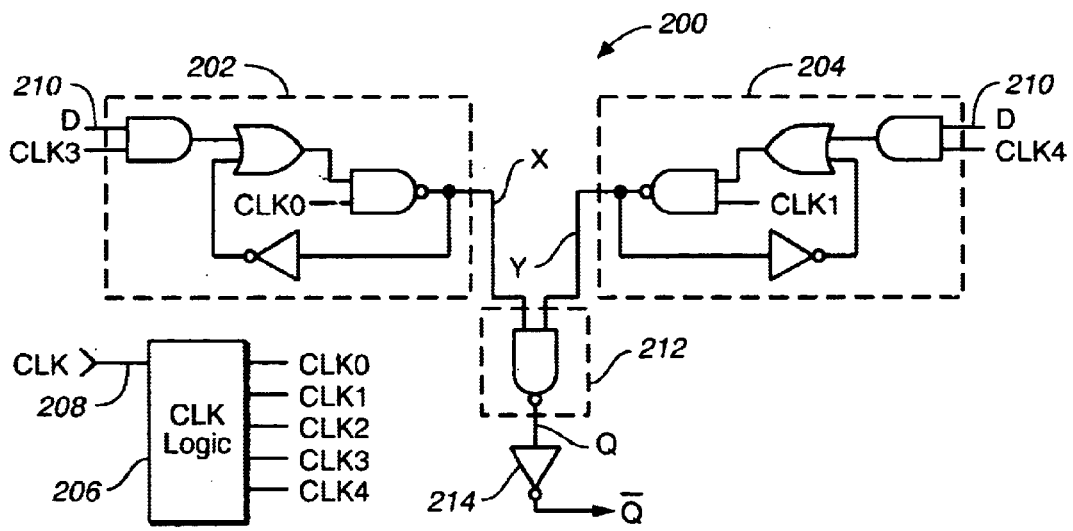
FIG._2

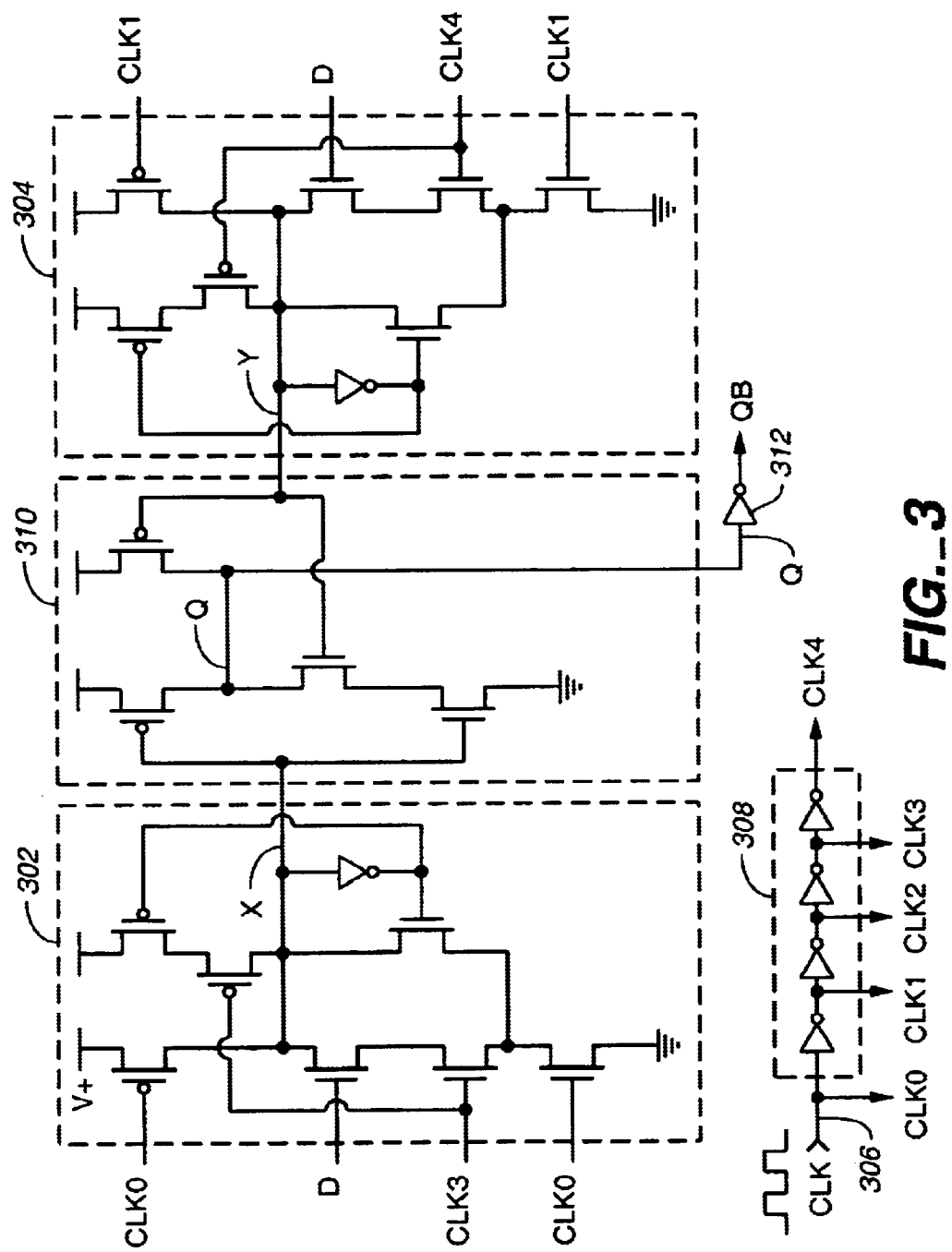
FIG._3

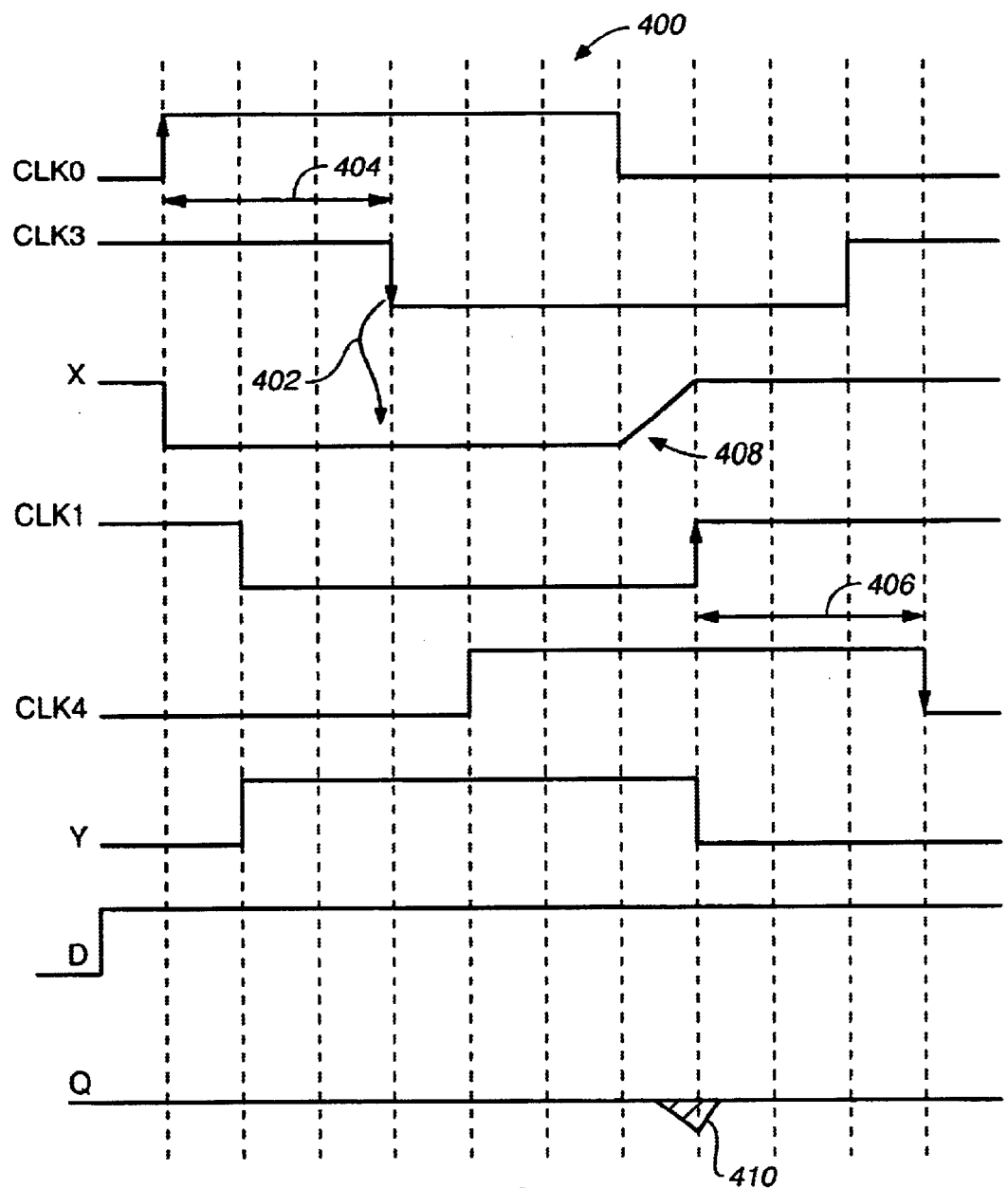
FIG._4

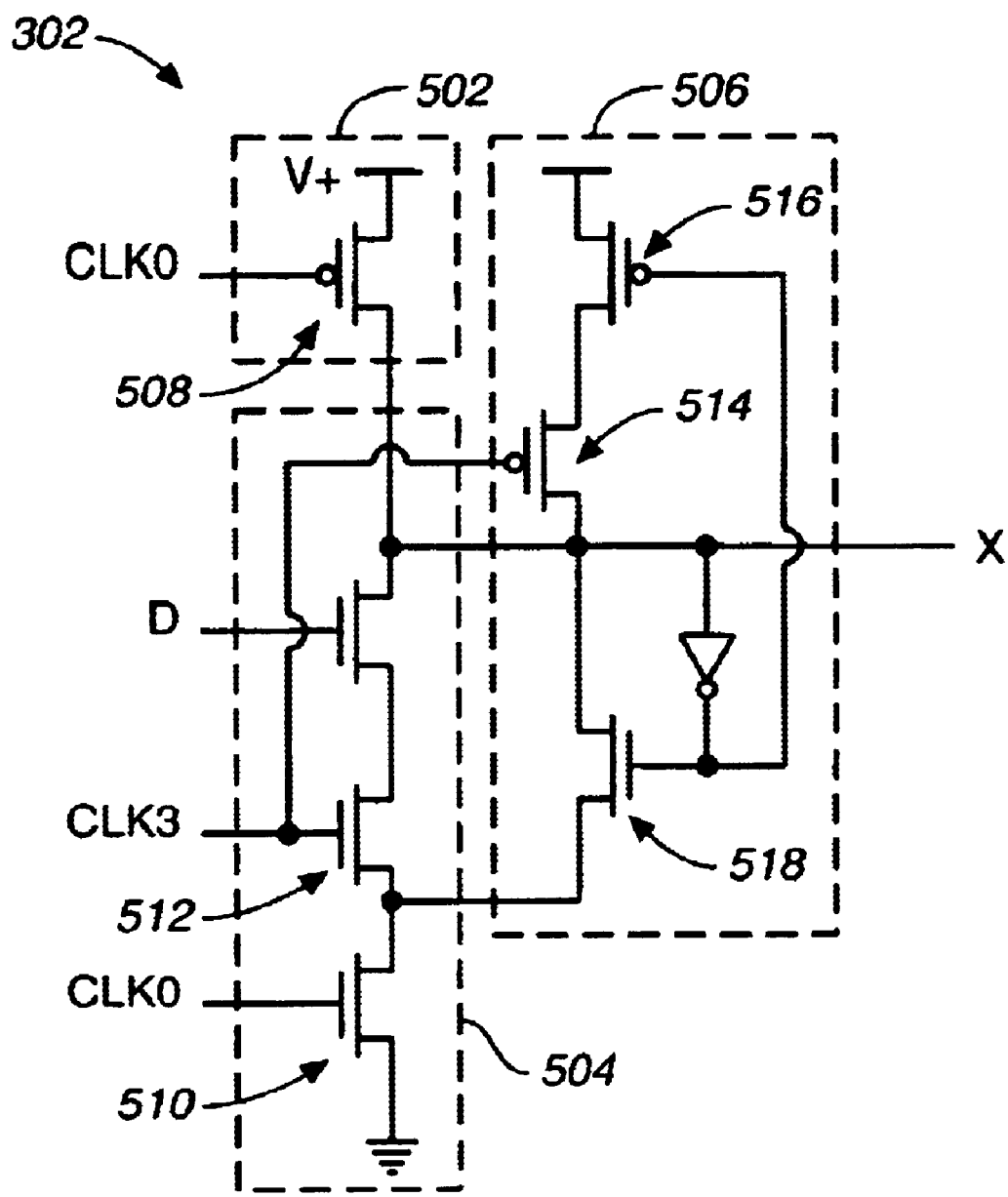
FIG._5

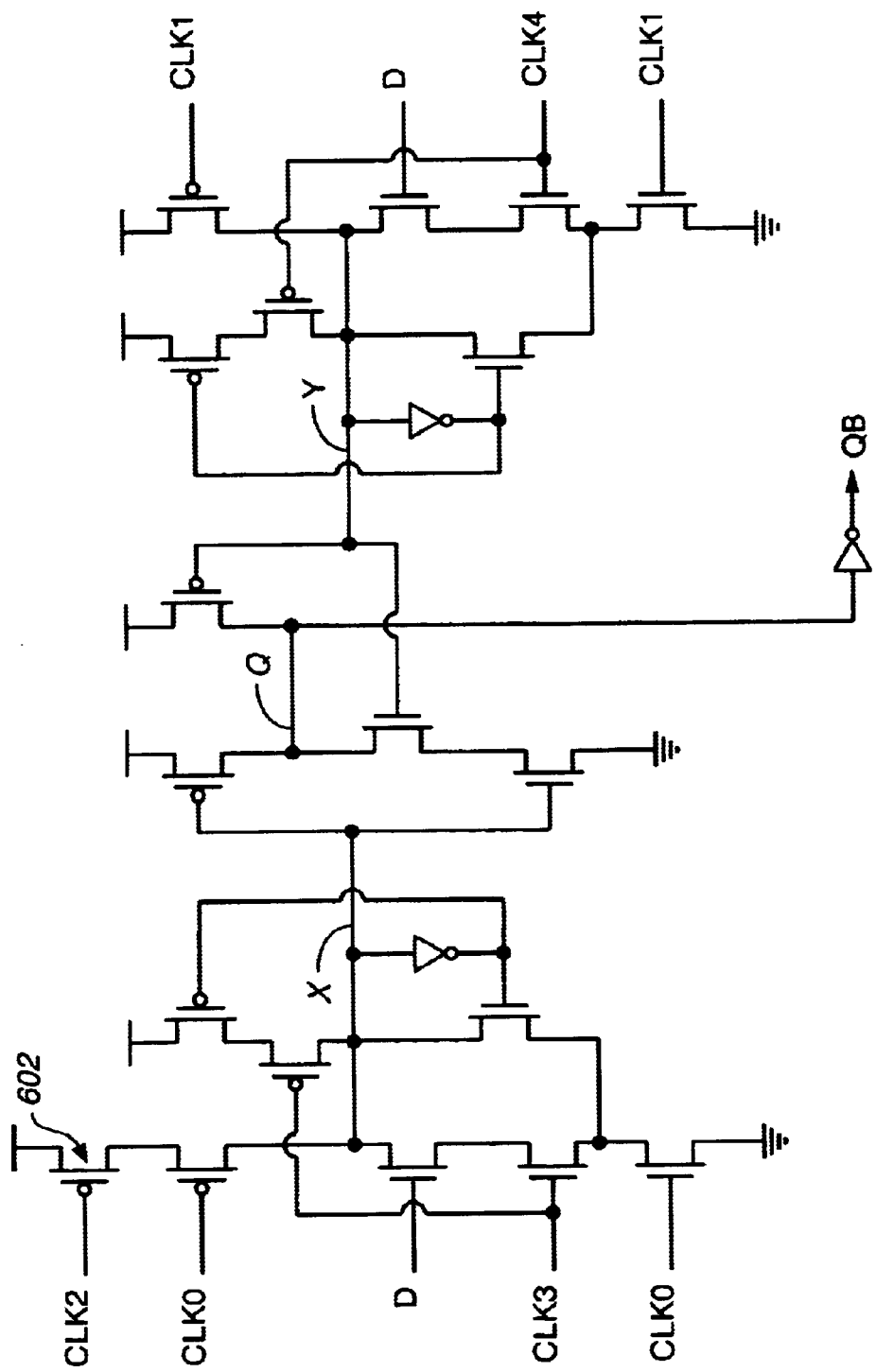
FIG._6

SYSTEM FOR SYMMETRIC PULSE GENERATOR FLIP-FLOP

FIELD OF THE INVENTION

The present invention relates generally to flip-flop circuits, and more particularly, to a system for providing a symmetric pulse generator flip-flop.

BACKGROUND OF THE INVENTION

There is an ongoing demand for electronic devices that provide more and faster functionality, while requiring less power. As a result, electronic devices, such as personal computers, are designed to use faster and faster clock frequencies. However, with the increase in clock frequencies, clock-related power consumption is taking an increasing portion of the available power. For example, high-speed memories generally require more power than lower speed memories.

In a move to reduce clock-related power consumption, dual edge-triggered storage elements (DETSE) have been used. A DETSE samples data at each transition of an input clock signal as opposed to conventionally used clocked storage elements referred to as single edge-triggered storage elements (SETSE), which capture data at their input based on one clock transition only.

Dual-edge clocking can potentially achieve roughly the same throughput with half of the clock frequency and thus consume only half of the clock-related power, as opposed to a SETSE designed circuit. However, in order to keep timing overhead low, dual-edge clocking requires tight control of the clock duty cycle and uncertainties related to both clock edges. Thus, because of the large circuit complexity, due to the need to capture data at two clock edges rather than one, current DETSE circuits may exhibit larger delays and power consumption than their single edge-triggered counterparts.

Therefore, it would be desirable to have a DETSE that is designed to have low power and fast operating speeds.

SUMMARY OF THE INVENTION

The present invention includes a Symmetric Pulse Generator Flip-Flop (SPG-FF). In one embodiment, a flip-flop constructed in accordance with the present invention comprises two pulse generator stages that each respond to one particular transition of an input clock signal. Thus, the flip-flop is triggered on both the rising and falling edge of the clock signal to capture an input data signal. The outputs of the generator stages are combined to form a flip-flop output. As a result, a flip-flop constructed in accordance with the present invention provides comparatively faster operating speed and lower power than conventional circuits.

In one embodiment included in the present invention, a symmetric pulse generator (SPG) flip-flop is provided that operates to receive an input data signal and an input clock signal to produce a flip-flop output signal. The SPG flip-flop comprises clock logic that receives the input clock signal and produces first, second, and third timing signals. The generator also comprises a first pulse generator stage that receives the input data signal, the input clock signal, and the first timing signal, and generates a first generator output signal. The SPG flip-flop also comprises a second pulse generator stage that receives the input data signal, and the second and third timing signals, and generates a second generator output signal. The SPG flip-flop also comprises logic to combine the first and second generator output signals to produce the flip-flop output signal.

In another embodiment included in the present invention, a method for providing an SPG flip-flop that operates to receive an input data signal and an input clock signal to produce a flip-flop output signal is provided. The method comprises steps of producing first, second, and third timing signals from the input clock signal, generating a first generator output signal from the input data signal, the input clock signal, and the first timing signal, generating a second generator output signal from the input data signal, and the second and third timing signals, and combining the first and second generator output signals to produce the flip-flop output signal.

BRIEF DESCRIPTION OF THE DRAWINGS

The foregoing aspects and the attendant advantages of this invention will become more readily apparent by reference to the following detailed description when taken in conjunction with the accompanying drawings wherein:

FIG. 1 shows a block diagram of one embodiment of an SPG-FF constructed in accordance with the present invention;

FIG. 2 shows a functional diagram of one embodiment of an SPG-FF constructed in accordance with the present invention;

FIG. 3 shows a schematic diagram of one embodiment of an SPG-FF constructed in accordance with the present invention;

FIG. 4 shows a timing diagram illustrating the operation of the SPG-FF of FIG. 3;

FIG. 5 shows a detailed diagram of a pulse generator stage constructed in accordance with the present invention; and FIG. 6 shows an alternate embodiment of an SPG-FF constructed in accordance with the present invention.

DETAILED DESCRIPTION

The present invention includes a Symmetric Pulse Generator flip-flop that provides high speed using low power. The (SPG-FF) responds to both rising and falling edges of an input clock signal. The following is a description of embodiments of an SPG-FF constructed in accordance with the present invention.

FIG. 1 shows a block diagram of one embodiment of an SPG flip-flop 100 constructed in accordance with the present invention. The flip-flop 100 includes a first stage pulse generator 102 and a second stage pulse generator 104 that receive an input data signal. Clock logic 106 receives an input clock signal 108 and generates clock phase signals 110 (or timing signals) that are input to the first and second stages. Outputs X and Y of the first and second stage are input to logic 112, where they are combined to form the flip-flop output signal 114.

In accordance with the present invention, the flip-flop 100 captures data in response to each clock edge of the clock signal 108. Thus, the flip-flop 100 operates at twice the speed of a SETSE, which can switch only at one clock edge.

FIG. 2 shows a functional diagram of one embodiment of an SPG flip-flop 200. The flip-flop 200 includes a first pulse generator stage 202 and a second pulse generator stage 204. Clock logic 206 receives an input clock signal 208 and produces clock signals (clk0–clk4). A portion of the clock signals (clk0, clk1, clk3, clk4) are input to the first and second pulse generator stages along with an input data signal 210.

The first and second pulse generators produce generator output signals indicated in FIG. 2 at X and Y, respectively.

The signals X and Y are input to logic 212, where they are combined to produce the flip-flop output Q. An additional inverter stage 214 is shown to indicate that the flip-flop output Q can be inverted if desired for use in another circuit.

FIG. 3 shows a schematic diagram of one embodiment of an SPG flip-flop 300 constructed in accordance with the present invention. FIG. 4 shows a timing diagram 400 of signals associated with the flip-flop 300. The following text describes operation of the flip-flop 300 with references made to the timing diagram 400.

Referring now to FIG. 3, the flip-flop 300 comprises two pulse generator stages (302, 304), where each stage responds to one particular transition of an input clock signal 306. The clock signal 306 is input to clock logic 308 that operates to generate several clock signals (timing signals) that are time shifted and may be inverted from the clock signal 306. For example, if the input clock signal 306 represents Clk0, the logic 308 generates Clk1, Clk2, Clk3 and Clk4. The generated clock signals are delayed from the input clock signal 306 based on the number of inverters 310 the signal flows through. Furthermore, in addition to the delay, the signals are either inverted or non-inverted with respect to the clock signal 306. Although shown as a series of four inverters, the logic 308 may comprise any suitable logic to generate the clock signals.

With regard to the operation of the pulse generator stages, it will be assumed that the data D signal is high when the Clk0 signal rises to a high level (i.e., "1"). The node Y is pre-charged (high) by the falling edge of Clk1. The node X, which was previously pre-charged ("1"), holds a value derived from the input signal D. For example, at the rising edge of Clk0, node X holds a low ("0") value determined by the data D being at a high level ("1"). The value of X captured at the falling edge of the Clk3 signal can be seen at 402 of the timing diagram 400. Thus, an acquisition window 404 is defined for node X. The window 404 extends from the rising edge of Clk0 to the falling edge of Clk3. During the window 404, a value for X, based on the data D, is captured. Thus, the acquisition window 404 (time period) is generated in response to the rising edge of the Clk0 signal that is generated from the input clock signal 306.

When the Clk0 signal falls low ("0"), node X is pre-charged (high). An acquisition window 406 for node Y is defined by the rising edge of Clk1 and the falling edge of Clk4. At the falling edge of Clk4, node Y captures a value based on the value of the input data signal D. The acquisition window for node Y is shown at 406. Only in this short time-window following the rising edge of Clk1 is node Y allowed to change, if the input D is high at that time. Thus, the acquisition window 406 (time period) is generated in response to the rising edge of the Clk1 signal that is generated from the input clock signal 306.

Therefore, the two pulse generation stages 302, 304 alternately capture a value based on the data value D. The logic stage 310 receives the values at nodes X and Y and combines these values to form the output Q, which is shown to be at a low level in the timing diagram of FIG. 4. The output Q may then be inverted, for example, by inverter 312, to form an inverted output QB.

In one embodiment included in the present invention, the logic stage 310 comprises a static NAND gate that merges active values of nodes X and Y. The NAND gate uses the fact that the alternate node is high in a particular clock half-cycle in which data D is sampled. The NAND gate combines the values at nodes X and Y to produce the output Q. For example, if the values on both nodes X and Y are a high level ("1"), then the output Q will be a low level ("0"). For any other values of X and Y, the output Q is a high level ("1").

Therefore, in accordance with the present invention, an SPG flip-flop is provided that includes two pulse generation stages that receive input data and clock signals to produce output pulses, at nodes X and Y. The flip-flop also includes a logic stage, for example, a NAND gate, that receives the values on nodes X and Y and produces a flip-flop output Q by combining those values. The clock signals are derived from an input clock that is fed into the clock logic. The clock logic generates clock signals (timing signals) that are used to determine acquisition time periods associated with the rising and falling edge of the input clock signal. The output Q may also be inverted by an additional inverter to form the inverted output QB.

Therefore, in accordance with the present invention, a method for providing an SPG flip-flop is provided. The method comprises the following steps.

1. Generating multiple clock signals from a received input clock that has rising and falling edges. The multiple clock signals having selected delays and inversions from the input clock.
2. Inputting an input data value and at least some of the clock signals to a first pulse generator that generates a first output pulse associated with a rising edge of the input clock signal.
3. Inputting the input data value and at least some of the clock signals to a second pulse generator that generates a second output pulse associated with a falling edge of the input clock signal.
4. Inputting the first and second output pulse signals to a NAND gate, where the NAND output forms the flip-flop output.

FIG. 5 shows a detailed diagram of the pulse generator stage 302 constructed in accordance with the present invention. Since pulse generators 302 and 304 are identical circuits, the description provided herein for generator 302 is equally applicable to generator 304. The generator 302 comprises a pre-charge circuit 502, an input circuit 504, and a keeper circuit 506.

The generator 302 is coupled to Clk0 and Clk3, where Clk0 is identical to the received input clock, for example, the input clock signal 306 shown in FIG. 3. The timing signal Clk3 is generated by the logic 308. The generator 302 operates to produce a pulse signal at node X. The basic operation of the generator can be described as follows.

1. Use the pre-charge circuit 502 to pre-charge node X to a high level when Clk0 is at a low level.
2. Use the input circuit 504 to set the value for node X based on the value of the input data D. The value is set during an acquisition period that is within the time that Clk0 is at a high level.
3. Use the keeper circuit 506 to capture the value set for node X until the next pre-charge cycle (i.e., Clk0 is at a low level).

The pre-charge cycle occurs when Clk0 is at a low level, which activates transistor 508 to pull node X up to the supply voltage (V+). When Clk0 goes to a high level, Clk3 is already at a high level. Because of this, transistors 510, 512 are turned on, while transistor 514 is turned off. With node X at a high level, transistor 516 is turned on, while transistor 518 is turned off.

When Clk0 goes to the high level, the acquisition period, shown at 404, begins. During this period, if the value of D is low, then X remains high. However, if the value of D is high, then X goes low. The acquisition period ends when Clk3 goes to a low level.

During the acquisition time period, if D is high, then X goes low. With X low, transistor 518 turns on and transistor 516 turns off. At the end of the acquisition period, Clk3 goes low. When this happens, transistor 512 turns off and transistor 514 turns on. Since Clk0 is still high, node X is kept low through transistors 518 and 510.

The keeper circuit is activated to hold the value of X when Clk3 goes low while Clk0 is high. If X is low, it continues to be kept low through transistors 518 and 510. If X is high, it continues to be kept high through transistors 514 and 516. When Clk0 goes low, a new pre-charge cycle begins and node X is again pulled to a high level.

Therefore, the pulse generator circuit 302 operates to generate a value for the node X based on the input data. This value is associated with the rising edge of Clk0. The pulse generator circuit 304 also operates to generate a value for the node Y based on the input data. However, the value at node Y is associated with the falling edge of Clk0. Thus, the SPG flip-flop included in the present invention operates to capture the input data for both edges of the input clock. These captured values are then combined to produce a flip-flop output. As a result, the SPG flip-flop achieves fast speed with reduced power.

SPG-FF Performance

The SPG flip-flop constructed in accordance with the present invention provides an improvement in power and speed over conventional single-edge devices and DET storage elements. The following text compares the operation of the SPG flip-flop included in the present invention with other devices in terms of delay and power consumption after being optimized for a minimum Energy-Delay Product (EDP) at input data activity of 50% with respect to maximum throughput. For example, if 100% is the maximum throughput, then this defines data changing half as fast as the clock for SETSE devices and data changing as fast as clock for DETSE devices.

In comparison to known DETSE circuits, for example, ep-DSFF circuits, the SPG-FF achieves approximately a 19% smaller EDP, a 7% smaller delay and a 34% smaller clock load. In comparison to known circuits referred to as transmission-gate latch-mux (TGLM) circuits, the SPG-FF achieves approximately a 14% lower EDP, a 26% lower delay, and 53% lower clock load.

In comparison with commercially available single edge-triggered storage elements (SETSE) used in modern processing systems, the SPG-FF achieves approximately a 10–20% lower EDP, 45–70% lower clock power and delays ranging from 25–40% higher to 20% lower.

The above results for the SETSE devices are given for twice the clock frequency as that of the DETSE devices to achieve the same data throughput. Clock power is power consumed by the driver of the clock input to the storage element. The clock power comparison indicates the size and number of clock buffers in the clock distribution network, and thus affects total power savings.

In order for a DETSE device to save 50% of clock distribution power, the clock load should be the same as that of the SETSE device, since in this case the same load is switched with half the clock frequency. It has been shown that SPG-FF has a comparable clock load to that of conventional SETSE devices used in high performance processors.

The EDP is adopted as a figure of merit, and the "better" flip-flop has lower EDP even when the delay is higher. Ideally, the delay can be traded for power consumption. Therefore, a circuit with a lower EDP but higher delay can ideally be resized to achieve lower delay with comparably increased power consumption such that EDP remains the same or (in practice) only slightly increases.

In summary, SPG-FF exhibits lower delay, EDP, and far lower clock load than the best previous DETSE circuits, and at least comparable performance—lower EDP, lower or comparable clock load, and in some cases higher delay than conventional SETSE devices used in high performance processors. Thus, the SPG-FF constructed in accordance with the present invention provides a large performance improvement over prior DETSE circuits.

Alternate Embodiment

Referring now to FIG. 4 at 408, there is indicated a region where the node X transitions from a low to high level at the start of a pre-charge stage. It may occur, for example, based on the technology used in practical application, that the transition shown at 408 results in an undesirable output, as shown at 410. The output 410 may occur when the nodes X and Y are combined at the time the transition 408 occurs. In this case, the output 410 may fall to approximately less then twenty percent of the supply voltage (VDD). Such an output 410 may occur anytime the data D=1 and the previous Q was 1, at both clock edges. However, another embodiment included in the present invention operates to prevent such undesirable outputs.

FIG. 6 shows an alternate embodiment of an SPG-FF constructed in accordance with the present invention to prevent unwanted effects from a transition, such as transition 408. In the embodiment shown in FIG. 6, transistor 602 is included to delay the start of the pre-charge cycle so that node X does not transition to the pre-charge level until well into the acquisition period 406. This is accomplished by coupling transistor 602 to a Clk2 timing signal generated by the logic 308. This prevents the transition 408 from affecting the output signal Q to prevent the occurrence of undesirable effects like that shown at 410. Thus, in accordance with the embodiment shown in FIG. 6, an SPG-FF is provided that avoids unwanted effects due to signal transition at node X. A similar circuit arrangement may be provided to prevent unwanted effects at node Y.

The present invention includes a symmetric pulse generator flip-flop that provides high speed using low power. The embodiments described above are illustrative of the present invention and are not intended to limit the scope of the invention to the particular embodiments described. Accordingly, while one or more embodiments of the invention have been illustrated and described, it will be appreciated that various changes can be made therein without departing from the spirit or essential characteristics thereof. Accordingly, the disclosures and descriptions herein are intended to be illustrative, but not limiting, of the scope of the invention, which is set forth in the following claims.

What is claimed is:

1. A symmetric pulse generator (SPG) flip-flop that operates to receive an input data signal and an input clock signal to produce a flip-flop output signal, the SPG flip-flop comprising:

clock logic that receives the input clock signal and produces first, second, and third timing signals;

a first pulse generator stage that receives the input data signal, the input clock signal, and the first timing signal, and generates a first generator output signal;

a second pulse generator stage that receives the input data signal, and the second and third timing signals, and generates a second generator output signal; and logic to combine the first and second generator output signals to produce the flip-flop output signal.

2. The pulse generator of claim 1, wherein the logic to combine comprises a NAND gate.

3. The pulse generator of claim 1, wherein the clock logic comprises a plurality of inverters.

4. The pulse generator of claim 3, wherein the plurality of inverters comprise:
   a first inverter that receives the clock signal and produces the second timing signal;
   a second inverter that receives the second timing signal and produces a fourth timing signal;
   a third inverter that receives the forth timing signal and produces the first timing signal; and
   a fourth inverter that receives the first timing signal and produces the third timing signal.

5. The pulse generator of claim 1, wherein the first pulse generator stage comprises a pre-charge circuit, an input circuit and a keeper circuit.

6. The pulse generator of claim 5, wherein the input circuit comprises first, second and third input transistors.

7. The pulse generator of claim 5, wherein the keeper circuit comprises an inverter coupled to the gate terminals of first and second keeper transistors.

8. A method for providing an SPG flip-flop that operates to receive an input data signal and an input clock signal to produce a flip-flop output signal, the method comprising the steps of:
   producing first, second, and third timing signals from the input clock signal;
   generating a first generator output signal from the input data signal, the input clock signal, and the first timing signal;
   generating a second generator output signal from the input data signal, and the second and third timing signals; and
   combining the first and second generator output signals to produce the flip-flop output signal.

9. The method of claim 8, wherein the step of combining comprises a step of inputting the first and second generator output signals to a NAND gate to produce the flip-flop output signal at an output of the NAND gate.

10. The method of claim 8, wherein the step of producing first, second, and third timing signals from the input clock signal comprises a step of inputting the input clock signal to a plurality of inverters to produce the first, second, and third timing signals.

11. The method of claim 8, wherein the step of generating the first generator output signal comprises a step of generating the first generator output signal with a pre-charge circuit, an input circuit and a keeper circuit.

* * * * *